(12) United States Patent
Hendrikx et al.

(10) Patent No.: US 8,632,954 B2
(45) Date of Patent: Jan. 21, 2014

(54) METHOD FOR MAKING A LITHOGRAPHIC PRINTER PLATE PRECURSOR

(75) Inventors: Peter Hendrikx, Hamont-Achel (BE); Willi-Kurt Gries, Mainz-Kastel (DE); Marc Van Damme, Bonheiden (BE)

(73) Assignee: Agfa Graphics NV, Mortsel (BE)

( * ) Notice: Subject to any disclaimer, the term of this patent is extended or adjusted under 35 U.S.C. 154(b) by 777 days.

(21) Appl. No.: 12/594,091

(22) PCT Filed: May 15, 2008

(86) PCT No.: PCT/EP2008/055965
§ 371 (c)(1),
(2), (4) Date: Jan. 25, 2010

(87) PCT Pub. No.: WO2008/138966
PCT Pub. Date: Nov. 20, 2008

(65) Prior Publication Data
US 2010/0129755 A1     May 27, 2010

Related U.S. Application Data

(60) Provisional application No. 60/938,021, filed on May 15, 2007.

(30) Foreign Application Priority Data

May 15, 2007  (EP) .................................... 07108233

(51) Int. Cl.
*B41N 1/00* (2006.01)
*B41M 5/00* (2006.01)
*G03F 7/00* (2006.01)
*G03F 7/26* (2006.01)

(52) U.S. Cl.
USPC ............... 430/302; 430/270.1; 430/271.1; 430/286.1; 101/453; 101/463.1

(58) Field of Classification Search
USPC .......... 430/302, 454; 101/450.1, 453, 463.1
See application file for complete search history.

(56) References Cited

U.S. PATENT DOCUMENTS

| | | | |
|---|---|---|---|
| 4,329,422 A * | 5/1982 | Langlais | 430/331 |
| 5,240,812 A | 8/1993 | Conley et al. | |
| 5,786,127 A * | 7/1998 | Madoux et al. | 430/273.1 |
| 6,207,287 B1 * | 3/2001 | Alba et al. | 428/469 |
| 2003/0235776 A1 | 12/2003 | Goodin et al. | |
| 2005/0255407 A1 * | 11/2005 | Kuwabara | 430/300 |
| 2005/0266349 A1 * | 12/2005 | Van Damme et al. | 430/300 |
| 2008/0145789 A1 * | 6/2008 | Knight | 430/300 |
| 2009/0130596 A1 * | 5/2009 | Teng | 430/281.1 |

FOREIGN PATENT DOCUMENTS

| | | | |
|---|---|---|---|
| CA | 2051971 A1 * | 3/1992 | |
| EP | 0 477 686 A1 | 4/1992 | |
| EP | 1 342 568 B1 | 10/2005 | |
| WO | WO 02/21215 A1 | 3/2002 | |
| WO | WO 0221215 A1 * | 3/2002 | |
| WO | WO 2005/111727 A1 | 11/2005 | |
| WO | WO 2005111727 A1 * | 11/2005 | |
| WO | WO 2007057348 A1 * | 5/2007 | |

\* cited by examiner

*Primary Examiner* — Chanceity Robinson
(74) *Attorney, Agent, or Firm* — Leydig, Voit & Mayer, Ltd.

(57) ABSTRACT

A method for making a lithographic printing plate precursor is disclosed comprising the steps of a. providing a lithographic printing plate precursor including a support having a hydrophilic surface or which is provided with a hydrophilic layer, a photopolymerizable coating comprising a photopolymerizable composition, and an overcoat layer comprising a water soluble low molecular weight acid, wherein said overcoat layer has a surface pH-value ranging between 1 to 6; b. image-wise exposing the precursor; c. optionally heating the exposed precursor; d. processing the obtained precursor by applying a gum solution and optionally brushing the precursor, and/or by mounting the precursor on a plate cylinder of a lithographic printing press and rotating the plate cylinder while feeding dampening liquid and/or ink to the coating. The printing plate obtained after imaging and processing in an off-press configuration with a gum solution or in an on-press configuration with fountain solution and ink shows an improved roll-up performance in the start-up of a printing process on a printing press.

11 Claims, No Drawings

METHOD FOR MAKING A LITHOGRAPHIC PRINTER PLATE PRECURSOR

CROSS-REFERENCE TO RELATED APPLICATIONS

This patent application is a U.S. National Phase of copending International Application No. PCT/EP2008/55965, filed May 15, 2008, which claims the benefit of European Patent Application No. 07108233.3, filed May 15, 2007 and U.S. Provisional Patent Application No. 60/938,021, filed May 15, 2007, the disclosures of which are hereby incorporated by reference in their entireties.

FIELD OF THE INVENTION

The present invention relates to a method for making a lithographic printing plate precursor having a photopolymerisable coating by image-wise exposing this precursor and processing in an off-press configuration with a gum solution or in an on-press configuration with fountain solution and ink.

BACKGROUND OF THE INVENTION

In lithographic printing, a so-called printing master such as a printing plate is mounted on a cylinder of the printing press. The master carries a lithographic image on its surface and a printed copy is obtained by applying ink to said image and then transferring the ink from the master onto a receiver material, which is typically paper. In conventional, so-called "wet" lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called "driographic" printing, the lithographic image consists of ink-accepting and ink-adhesive (ink-repelling) areas and during driographic printing, only ink is supplied to the master.

Printing masters are generally obtained by the so-called computer-to-film (CtF) method, wherein various pre-press steps such as typeface selection, scanning, color separation, screening, trapping, layout and imposition are accomplished digitally and each color selection is transferred to graphic arts film using an image-setter. After processing, the film can be used as a mask for the exposure of an imaging material called plate precursor and after plate processing, a printing plate is obtained which can be used as a master. Since about 1995, the so-called 'computer-to-plate' (CtP) method has gained a lot of interest. This method, also called 'direct-to-plate', bypasses the creation of film because the digital document is transferred directly to a printing plate precursor by means of a so-called plate-setter. A printing plate precursor for CtP is often called a digital plate.

Digital plates can roughly be divided in three categories: (i) silver plates, which work according to the silver salt diffusion transfer mechanism; (ii) photopolymer plates which contain a photopolymerizable composition that hardens upon exposure to light and (iii) thermal plates of which the imaging mechanism is triggered by heat or by light-to-heat conversion. Thermal plates are mainly sensitized for infrared lasers emitting at 830 nm or 1064 nm. Photopolymers can be sensitized for blue, green or red light (i.e. wavelength range between 450 and 750 nm), for violet light (i.e. wavelength range between 350 and 450 nm) or for infrared light (i.e. wavelength range between 750 and 1500 nm). Laser sources have been increasingly used to expose a printing plate precursor which is sensitized to a corresponding laser wavelength. Typically, an Ar laser (488 nm) or a FD-YAG laser (532 nm) can be used for exposing a visible light sensitized photopolymer plate. The wide-scale availability of low cost blue or violet laser diodes, originally developed for data storage by means of DVD, has enabled the production of plate-setters operating at shorter wavelength. More specifically, semiconductor lasers emitting from 350 to 450 nm have been realized using an InGaN material. An infrared laser diode emitting around 830 nm or a Nd-YAG laser emitting around 1060 nm can also be used.

Typically, a photopolymer plate is processed in alkaline developer having a pH>10. Currently, most commercial lithographic plates require an additional gumming process after the exposed plates is developed and before it is put on the press, in order to protect the plate from contamination, e.g. by oxidation, fingerprints, fats, oil or dust, or from damaging, e.g. by scratches during handling of the plate. Such an additional gumming step is not convenient for the end-user, because it is a time consuming step and requires an additional gumming station.

WO 02/101 469 discloses a method of processing an imagable element useful as alkaline-developable lithographic printing plate precursor wherein the element is developed and gummed with an aqueous alkaline developing-gumming solution comprising a water-soluble polyhydroxy compound having a specific structure.

EP 1 342 568 discloses a method for making a heat-sensitive lithographic printing plate wherein the image-wise heated precursor, comprising a coating of hydrophobic thermoplastic polymer particles which coalescence on heating, is developed with a gum solution. A practical embodiment for this type of printing plates was introduced by Agfa under the tradename Azura.

WO 2005/111727 discloses a method for making a lithographic printing plate wherein the image-wise exposed precursor, comprising a photopolymerisable coating, is developed with a gumming solution.

In WO 2006/026229, EP 1 602 982, EP 1 621 339, EP 1 630 618, EP 1 705 522, EP 1 755 002 and US 2007/0020563, a method is disclosed wherein an image-wise exposed photopolymer printing plate precursor is developed with an aqueous solution.

In U.S. Pat. No. 6,027,857, U.S. Pat. No. 6,171,735, U.S. Pat. No. 6,420,089, U.S. Pat. No. 6,071,675, U.S. Pat. No. 6,245,481, U.S. Pat. No. 6,387,595, U.S. Pat. No. 6,482,571, U.S. Pat. No. 6,576,401, WO 93/05446, WO 03/087939, EP 1 518 672, EP 1 562 078, EP 1 577 090, US 2003/16577, US 2004/13968, WO 2005/111717 and WO 2006/007270 an alternative method is disclosed for preparing a lithographic printing plate wherein a photopolymer plate, after image-wise exposure, is mounted on a press and processed on-press by applying ink and fountain to remove the unexposed areas from the support.

A problem associated with the lithographic printing plate precursors of the prior art, after image-wise exposure, which are processed on-press with fountain and ink or which are processed and gummed in a single step by using a gumming solution, is an insufficient roll-up performance. This means that the ink acceptance at the printing areas, i.e. the exposed areas, is too weak during the start-up of the printing process, resulting in a too low take-up of ink at the printing areas and a too low optical density on the first number of printed sheets. It is desirable that this number of these "unusable" printed sheets is as low as possible in order to reduce the waste of paper in the start-up of the printing process.

SUMMARY OF THE INVENTION

It is an object of the present invention to provide a method for making a lithographic printing plate precursor which, upon image-wise exposure and processing on-press with fountain solution and ink and/or processing and gumming off-press in a single step with a gum solution, exhibits an improved roll-up performance during the start-up of the printing process.

When a printing process is started, the printing plate is fed with fountain solution and ink or with a mixture of both fountain solution and ink. The non-printing areas are hydrophilic and accept the fountain solution. Usually, at the start of the printing process, the printing areas on the plate are not sufficiently hydrophobic, due to the presence of hydrophilic ingredients remaining on these areas such as gumming ingredients, and will accept the ink only in a lower amount than expected. This results in printed sheets with a poor visual image contrast, which are unusable for the customer. When more sheets are printed, the ink acceptance in the printing areas increases, and the visual image contrast on the printed sheets improves and, finally, after printing a number of sheets, it becomes acceptable for the customer. The roll-up is defined as the number of sheets necessary to achieve a visual image contrast acceptable for the customer. This means that the optical density in the printing areas is at least 80% of the final optical density after roll-up/start-up. An acceptable visual image contrast means also that the printed sheets are free of toning. Toning refers to a tendency of ink acceptance in the non-printing areas resulting in an increased optical density in the non-printing areas. The optical density on the printed sheets is measured with a GretagMacBeth D19C densitometer. The final optical density on the printed sheets may depend on the printing conditions and also on the type of ink, fountain solution and paper used in the printing process and is usually in the range of about 1.5 to about 1.8 for a black ink.

This object is realised by the method as defined herein, having the specific feature that the surface pH value of the precursor is in the range of 1 to 6. The inventors unexpectedly found that the roll-up performance is strongly improved when the surface pH value of the precursor is in the range of 1 to 6 for those precursors that have a photopolymer coating and an overcoat layer on top of it and that are processed on-press with fountain solution and ink or that are processed and gummed off-press in a single step with a gum solution. When the surface pH value is higher than 6, the printing plate shows a poor roll-up performance, i.e. the number of printed sheets with an insufficient ink density in the printing areas is strongly increased to about 50 sheets or more, resulting in an undesirable increase of waste paper.

It is also an object of the present invention that the precursor has a high lithographic quality such as a high resolution, an excellent clean-out and a high run length.

Other specific embodiments of the invention are defined in the dependent claims.

DETAILED DESCRIPTION OF THE INVENTION

In accordance with the present invention, there is provided a first method for making a lithographic printing plate precursor comprising the steps of
a. providing a lithographic printing plate precursor including a support having a hydrophilic surface or which is provided with a hydrophilic layer, a photopolymerizable coating comprising a photopolymerizable composition, and an overcoat layer comprising a water soluble low molecular weight acid, wherein said overcoat layer has a surface pH-value ranging between 1 to 6;
b. image-wise exposing the precursor;
c. optionally heating the exposed precursor;
d. processing and gumming the precursor by applying a gum solution and optionally brushing the precursor, thereby removing at least part of the coating at non-exposed areas and gumming the plate in one single step.

The overcoat layer preferably has a surface pH-value ranging between 2.5 to 5.95, more preferably ranging between 3.5 to 5.80 and most preferably ranging between 4 to 5.5.

In accordance with the present invention, there is provided a second method for making a lithographic printing plate precursor comprising the steps of
a. providing a lithographic printing plate precursor including a support having a hydrophilic surface or which is provided with a hydrophilic layer, a photopolymerizable coating comprising a photopolymerizable composition, and an overcoat layer comprising a water soluble low molecular weight acid, wherein said overcoat layer has a surface pH-value ranging between 1 to 6;
b. image-wise exposing the precursor;
c. optionally heating the exposed precursor;
d. processing the precursor by mounting the precursor on a plate cylinder of a lithographic printing press and rotating the plate cylinder while feeding dampening liquid and/or ink to the coating, thereby removing non-exposed areas of the coating.

The overcoat layer preferably has a surface pH-value ranging between 2.5 to 5.95, more preferably ranging between 3.5 to 5.80 and most preferably ranging between 4 to 5.5. Before the on press processing step, the exposed precursor may be gummed by applying a gum solution.

The printing plate obtained by the first method or by the second method exhibits an improved roll-up performance in the start-up of a printing process on a printing press. This property is very desirable in order to reduce the waste of paper in the start-up of a printing plate on the printing press. This property is unexpectedly obtained when the printing plate precursor comprises a water soluble low molecular weight acid in the overcoat layer, resulting in a surface pH value of the precursor between 1 and 6. This surface pH value is measured on top of the overcoat layer of the precursor by the method as disclosed in the examples. Due to the fact that the acid is water soluble and has a low molecular weight, the acid unexpectedly influences the adhesion of the overcoat layer onto the photopolymerizable coating, such that the overcoat layer can easily be removed during processing, but also that the overcoat layer adheres sufficiently to the photopolymerizable coating before processing, such that the precursor material can be handled such as during image-wise exposure. Probably, this acid is capable of reducing the intermixing between the overcoat layer and the photopolymerizable coating until a minimum level, sufficiently for adherence of the overcoat layer to the photopolymerizable coating. During the processing of the image-wise exposed precursor with a gum solution in an off-press configuration or with dampening liquid and/or ink in an on-press configuration, the photopolymerisable coating at the non-exposed areas is solubilised and/or dispersed into the gum solution or the dampening liquid/ink and, unexpectedly, also the overcoat layer at the exposed areas exhibits an increased tendency of solubilisation in the gum solution or the dampening liquid/ink. After the processing, the surface of the coating at printing areas is less hydrophilic (or more hydrophobic), resulting in an improved ink acceptance at the printing areas and also in an improved roll-up performance.

The Support

A particularly preferred lithographic support is and electrochemically grained and anodized aluminum support. Graining and anodizing of aluminum supports is well known.

The acid used for graining can be e.g. nitric acid or sulfuric acid. The acid used for graining preferably comprises hydrogen chloride. Also mixtures of e.g. hydrogen chloride and acetic acid can be used. The relation between electrochemical graining and anodizing parameters such as electrode voltage, nature and concentration of the acid electrolyte or power consumption on the one hand and the obtained lithographic quality in terms of Ra and anodic weight (g/m$^2$ of $Al_2O_3$ formed on the aluminum surface) on the other hand is well known. More details about the relation between various production parameters and Ra or anodic weight can be found in e.g. the article "Management of Change in the Aluminium Printing Industry" by F. R. Mayers, published in the ATB Metallurgie Journal, volume 42 nr. 1-2 (2002) pag. 69.

In the unpublished EP-A 06 110 468 (filed on 2006 Feb. 28) a characterizing method of the surface of a grained and anodized aluminum is disclosed. The parameter 'mean pith depth', calculated according to this characterizing method, correlates with the number and depth of the pits present at the aluminum surface. The mean pith depth of the aluminum surface is preferably less then 2.0 μm, more preferably less then 1.8 μm, most preferably less then 1.5 μm. The standard deviation of the 'mean pith depth' is preferably less then 0.70, more preferably less then 0.50, most preferably less then 0.35.

The anodized aluminum support may be subject to a so-called post-anodic treatment to improve the hydrophilic properties of its surface. For example, the aluminum support may be silicated by treating its surface with a sodium silicate solution. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or may be carried out at a slightly elevated temperature of about 30 to 50° C. A further interesting treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulfonic acid, polyvinylbenzenesulfonic acid, sulfuric acid esters of polyvinyl alcohol, and acetals of polyvinyl alcohols formed by reaction with a sulfonated aliphatic aldehyde.

Another useful post-anodic treatment may be carried out with a solution of polyacrylic acid or a polymer comprising at least 30 mol %, of acrylic acid monomeric units, e.g. GLASCOL E15, a polyacrylic acid, commercially available from ALLIED COLLOIDS.

The grained and anodized aluminum support may be a sheet-like material such as a plate or it may be a cylindrical element such as a sleeve which can be slid around a print cylinder of a printing press.

The support can also be a metal support such as aluminum or stainless steel. The metal can also be laminated to a plastic layer, e.g. polyester film. Alternative supports for the plate precursor can also be used, such as amorphous metallic alloys (metallic glasses). Such amorphous metallic alloys can be used as such or joined with other non-amorphous metals such as aluminum. Examples of amorphous metallic alloys are described in U.S. Pat. No. 5,288,344, U.S. Pat. No. 5,368,659, U.S. Pat. No. 5,618,359, U.S. Pat. No. 5,735,975, U.S. Pat. No. 5,250,124, U.S. Pat. No. 5,032,196, U.S. Pat. No. 6,325,868, and U.S. Pat. No. 6,818,078, the disclosures of which are incorporated by reference. The following references describe the science of amorphous metals in much more detail and are incorporated as references: Introduction to the Theory of Amorphous Metals, N. P. Kovalenko et al. (2001); Atomic Ordering in Liquid and Amorphous Metals, S. I. Popel, et al; Physics of Amorphous Metals, N. P. Kovalenko et al (2001). The metal surface can be grained and anodized as described above.

The support can also be a flexible support, which may be provided with a hydrophilic layer, hereinafter called 'base layer'. The flexible support is e.g. paper, plastic film or aluminum. Preferred examples of plastic film are polyethylene terephthalate film, polyethylene naphthalate film, cellulose acetate film, polystyrene film, polycarbonate film, etc. The plastic film support may be opaque or transparent.

The base layer is preferably a cross-linked hydrophilic layer obtained from a hydrophilic binder cross-linked with a hardening agent such as formaldehyde, glyoxal, polyisocyanate or a hydrolyzed tetra-alkylorthosilicate. The latter is particularly preferred. The thickness of the hydrophilic base layer may vary in the range of 0.2 to 25 μm and is preferably 1 to 10 μm. More details of preferred embodiments of the base layer can be found in e.g. EP-A 1 025 992.

The Photopolymerisable Coating.

The lithographic printing plate precursor used in the methods of this invention comprises a photopolymerisable coating on a support. Said photopolymerisable coating comprises a photopolymerizable composition. Said photopolymerisable coating may be one layer or may contains two or more layers comprising a photopolymerisable composition. Said layer comprising a photopolymerisable composition or said group of two or more layers comprising a photopolymerisable composition are hereinafter also referred to as "photopolymerisable layer" or "photopolymerisable layers". The photopolymerisable coating may further comprise an intermediate layer between the photopolymerizable layer and the support. When two or more photopolymerisable layers are present, an intermediate layer is preferably present between the support and that photopolymerisable layer which is nearest to the support.

The thickness of the photopolymerizable layer preferably ranges between 0.4 and 10 g/m$^2$, more preferably between 0.5 and 5 g/m$^2$, most preferably between 0.6 and 3 g/m$^2$.

The photopolymerizable composition typically comprises (i) a polymerizable compound, (ii) a polymerization initiator capable of hardening said polymerizable compound in the exposed areas and (iii) a binder. The photopolymerizable composition may further comprise an adhesion promoting compound.

The Polymerizable Compound and the Polymerization Initiator

According to one embodiment of the present invention, said polymerizable composition is a cationic photopolymerisable composition. This means that the polymerizable composition comprises a photopolymerisable compound which is polymerisable monomer or oligomer having at least one epoxy or vinyl ether functional group, hereinafter also referred to as "cationic polymerisable monomer". The polymerization initiator in the cationic photopolymerisable composition may be a Bronsted acid generator capable of generating free acid, optionally in the presence of a sensitizer, upon exposure. Said polymerization initiator is hereinafter also referred to as "cationic photoinitiator" or "cationic initiator".

Suitable cationic polymerisable monomers may be polyfunctional epoxy monomers include, for example, 3,4-epoxycyclohexylmethyl-3,4-epoxycyclohexane carboxylate, bis-(3,4-epoxycyclohexylmethyl) adipate, difunctional bisphenol-A epichlorohydrin epoxy resin and multifunctional epichlorohydrinitetraphenylol ethane epoxy resin.

Suitable cationic photoinitiators include, for example, triarylsulfonium hexafluoroantimonate, triarylsulfonium hexafluorophosphate, diaryliodonium hexafluoroantimonate, and haloalkyl substituted s-triazine. It is noted that most cationic initiators are also free radical initiators because, in addition to generating Bronsted acid, they also generate free radicals during photo or thermal decomposition.

According to a preferred embodiment of the present invention, said polymerizable composition is a free-radical photopolymerisable composition. This means that the polymerizable composition comprises a photopolymerisable compound which is polymerisable monomer or oligomer having at least one ethylenically unsaturated double bond, hereinafter also referred to as "free-radical polymerizable monomer" or "polymerisable monomer" or "monomer". Said free-radical polymerisable monomer or oligomer has preferably at least one terminal ethylenically unsaturated double bond. Said free-radical polymerisable monomer or oligomer has preferably 2, 3, 4, 5 or 6 terminal ethylenically unsaturated bonds. The polymerization initiator in the free-radical photopolymerisable composition may be a compound, capable of generating free radical, optionally in the presence of a sensitizer, upon exposure, hereinafter said initiator also referred to as "free radical initiator".

The photopolymerizable composition comprises one or more polymerizable monomer(s) or oligomer(s). Suitable free-radical polymerizable monomers include, for example, multifunctional (meth)acrylate monomers (such as (meth) acrylate esters of ethylene glycol, trimethylolpropane, pentaerythritol, ethoxylated ethylene glycol and ethoxylated trimethylolpropane, multifunctional urethanated(meth) acrylate, and epoxylated(meth)acrylate), and oligomeric amine diacrylates. The (meth)acrylic monomers may also have other double bond or epoxide group, in addition to (meth)acrylate group. The (meth)acrylate monomers may also contain an acidic (such as carboxylic acid) or basic (such as amine) functionality.

Preferred monomers include esters of an unsaturated carboxylic acid (e.g. acrylic acid, methacrylic acid, itaconic acid, crotonic acid, isocrotonic acid, and maleic acid) and an aliphatic polyhydric alcohol compound, such as: ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol pentaacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimediacrylate, pentaerythritol trimethacrylate, pentaerythritol tetramethacrylate, dipentaerythritol dimethacrylate, dipentaerythritol hexamethacrylate, dipentaerythritol pentamethacrylate, sorbitol trimethacrylate, sorbitol tetramethacrylate, bis[p-(3-methacryloxy-2-hydroxypropoxy) phenyl]dimethylmethane, and bis[p-(methacryloxyethoxy) phenyl]dimethylmethane, ethylene glycol diitaconate, propylene glycol diitaconate, 1,5-butanediol diitaconate, 1,4-butanediol diitaconate, tetramethylene glycol diitaconate, pentaerythritol diitaconate, and sorbitol tetraitaconate, ethylene glycol dicrotonate, tetramethylene glycol dicrotonate, pentaerythritol dicrotonate, sorbitol tetradicrotonate, ethylene glycol diisocrotonate, pentaerythritol diisocrotonate, and sorbitol tetraisocrotonate, ethylene glycol dimaleate, triethylene glycol dimaleate, pentaerythritol dimaleate and sorbitol tetramaleate.

Other preferred monomers include amides of an unsaturated carboxylic acid and an aliphatic polyhydric amine compound, such as: methylene bisacrylamide, methylene bismethacrylamide, 1,6-hexamethylene bisacrylamide, 1,6-hexamethylene bismethacrylamide, diethylenetriamine trisacrylamide, xylylene bisacrylamide and xylylene bismethacrylamide.

Also preferred monomers include urethane compounds containing two or more ethylenically unsaturated bonds. These polymerizable compounds are reaction products of a polyisocyanate compound, containing two or more isocyanate groups, with a multifunctional alcohol of which the hydroxyl groups are partly or completely esterified with (meth)acrylic acid. Particularly preferred compounds are prepared by reacting hydroxyalkyl(meth)acrylates with diisocyanates, as disclosed in DE 28 22 190 and DE 20 64 079.

Other preferred monomers contain primary, secondary and in particular tertiary amino groups, thio or enol groups, as disclosed in EP 1 349 006 (paragraph [0014] to [0024]). An example of a particularly preferred monomer is:

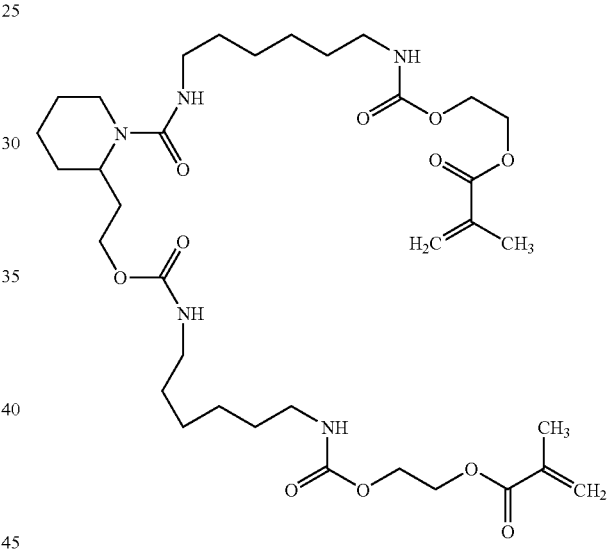

The photopolymerizable composition may also contain polyfunctional(meth)acrylate or alkyl(meth)acrylate compounds as crosslinking agents. Such compounds contain more than 2, preferably between 3 and 6 (meth)acrylate and/ or alkyl(meth)acrylate groups and include in particular (meth)acrylates of saturated aliphatic or alicyclic trivalent or polyvalent alcohols such as trimethylol ethane, trimethylol propane, pentaerythritol or dipentaerythritol.

The total amount of polymerizable compounds typically ranges from 10 to 90 percent by weight, preferably from about 20 to 80 percent by weight, relative to the total weight of the non volatile components of the photopolymerizable layer.

Any free-radical initiator capable of generating free radical directly or in the presence of a sensitizer upon exposure can be used as a free-radical initiator of this invention. Suitable free-radical initiators include: aromatic ketones, aromatic onium salts, organic peroxides, thio compounds, hexaarylbisimidazole compounds, ketoxime ester compounds, borate compounds, azinium compounds, metallocene compounds, active ester compounds and compounds having a carbon-halogen bond. Many specific examples of such compounds are found in EP-A 1 091 247 (paragraph [0068] to [0095]), WO2005/111 717 (page 16 to page 31) and EP-A 1 491 536 (paragraph [0046] to paragraph [0080]).

Preferred initiators are hexaarylbisimidazole compounds, titanocene compounds, trihalomethyl compounds and onium salts. Most preferred initiators are titanocene and hexarylbisimadazole compounds. Preferred titanocene compounds are described in EP-A 1 491 536 (paragraph [66] and [67]).

Particularly preferred initiators are hexaarylbisimidazole (HABI) compounds. Preparation methods of these compounds are described in DE 1 470 154 and their use in photopolymerizable compositions is described in EP 24 629, EP 107 792, U.S. Pat. No. 4,410,621, EP 215 453 and DE 3 211 312. Preferred derivatives are e.g. 2,4,5,2',4',5'-hexaphenyl-bisimidazole, 2,2'-bis(2-chlorophenyl)-4,5,4',5'-tetraphenyl-bisimidazole, 2,2'-bis(2-bromophenyl)-4,5,4',5'-tetraphenyl-bisimidazole, 2,2'-bis(2,4-dichlorophenyl)-4,5,4',5'-tetraphenylbisimidazole, 2,2'-bis(2-chlorophenyl)-4,5,4',5'-tetrakis(3-methoxyphenyl)bisimidazole, 2,2'-bis(2-chlorophenyl)-4,5,4',5'-tetrakis(3,4,5-trimethoxyphenyl) bisimidazole, 2,5,2',5'-tetrakis(2-chlorophenyl)-4,4'-bis(3,4-dimethoxyphenyl)bisimidazole, 2,2'-bis(2,6-dichlorophenyl)-4,5,4',5'-tetraphenylbisimidazole, 2,2'-bis (2-nitrophenyl)-4,5,4',5'-tetraphenylbisimidazole, 2,2'-di-o-tolyl-4,5,4',5'-tetraphenylbisimidazole, 2,2'-bis(2-ethoxyphenyl)-4,5,4',5'tetraphenylbisimidazole and 2,2'-bis (2,6-difluorophenyl)-4,5,4',5'-tetraphenylbisimidazole.

A mixture of two or more different initiators described above may be used in the present invention.

A very high sensitivity can be obtained in the context of the present invention by the combination of an optical brightener as sensitizer and a hexaarylbisimidazole as photoinitiator.

Other suitable free-radical initiators are: derivatives of acetophenone (such as 2,2-dimethoxy-2-phenylacetophenone, and 2-methyl-1-[4-(methylthio)phenyl-2-morpholino propan-1-one); benzophenone; benzil; ketocoumarin (such as 3-benzoyl-7-methoxy coumarin and 7-methoxy coumarin); xanthone; thioxanthone; benzoin or an alkyl-substituted anthraquinone; onium salts (such as diaryliodonium hexafluoroantimonate, diaryliodonium triflate, (4-(2-hydroxytetradecyl-oxy)-phenyl)phenyliodonium hexafluoroantimonate, triarylsulfonium hexafluorophosphate, triarylsulfonium p-toluenesulfonate, (3-phenylpropan-2-onyl)triaryl phosphonium hexafluoroantimonate, and N-ethoxy(2-methyl)pyridinium hexafluorophosphate, and onium salts as described in U.S. Pat. Nos. 5,955,238, 6,037,098, and 5,629, 354); borate salts (such as tetrabutylammonium triphenyl(n-butyl)borate, tetraethylammonium triphenyl(n-butyl)borate, diphenyliodonium tetraphenylborate, and triphenylsulfonium triphenyl(n-butyl)borate, and borate salts as described in U.S. Pat. Nos. 6,232,038 and 6,218,076,); haloalkyl substituted s-triazines (such as 2,4-bis(trichloromethyl)-6-(p-methoxy-styryl)-s-triazine, 2,4-bis(trichloromethyl)-6-(4-methoxy-naphth-1-yl)-s-triazine, 2,4-bis(trichloromethyl)-6-piperonyl-s-triazine, and 2,4-bis(trichloromethyl)-6-[(4-ethoxy-ethyleneoxy)-phen-1-yl]-s-triazine, and s-triazines as described in U.S. Pat. Nos. 5,955,238, 6,037,098, 6,010,824 and 5,629,354); and titanocene (bis(etha.9-2,4-cyclopenta-dien-1-yl)bis[2,6-difluoro-3-(1H-pyrrol-1-yl)phenyl)titanium).

The amount of the initiator typically ranges from 0.01 to 30 percent by weight, preferably from 0.5 to 20 percent by weight, relative to the total weight of the non volatile components of the photo-polymerizable layer.

The photopolymerisable composition in the present invention may be also a combination of a free-radical photopolymerisable composition and a cationic photopolymerisable composition. This means that a mixture of the components of both photopolymerisable compositions are present in one photopolymerisable layer of the coating. When two or more photopolymerisable layers are present in the coating, at least one of the layers may comprise a free-radical photopolymerisable composition and at least one of the other layers may comprise a cationic photopolymerisable composition.

The polymerizable monomer or oligomer in such combined photopolymerisable compositions may be a combination of a monomer or oligomer comprising at least one epoxy or vinyl ether functional group and a polymerizable ethylenically unsaturated compound, having at least one terminal ethylenic group, and said initiator may be a combination of a cationic initiator and a free-radical initiator. A monomer or oligomer comprising at least one epoxy or vinyl ether functional group and a polymerizable ethylenically unsaturated compound, having at least one terminal ethylenic group, can be the same compound wherein the compound contains both ethylenic group and epoxy or vinyl ether group. Examples of such compounds include epoxy functional acrylic monomers, such as glycidyl acrylate. The free radical initiator and the cationic initiator can be the same compound if the compound is capable of generating both free radical and free acid. Examples of such compounds include various onium salts such as diaryliodonium hexafluoroantimonate and s-triazines such as 2,4-bis(trichloromethyl)-6-[(4-ethoxyethylenoxy)-phen-1-yl]-s-triazine which are capable of generating both free radical and free acid in the presence of a sensitizer.

The photopolymerizable composition may also comprise a multifunctional monomer. This monomer contains at least two functional groups selected from an ethylenically unsaturated group and/or an epoxy or vinyl ether group. Particular multifunctional monomers for use in the photopolymer coating are disclosed in U.S. Pat. No. 6,410,205, U.S. Pat. No. 5,049,479, EP 1079276, EP 1369232, EP 1369231 EP 1341040, US 2003/0124460, EP 1241002, EP 1288720 and in the reference book including the cited references: Chemistry & Technology UV & EB formulation for coatings, inks & paints—Volume 2—Prepolymers and Reactive Diluents for UV and EB Curable Formulations by N. S. Allen, M. A. Johnson, P. K. T. Oldring, M. S. Salim—Edited by P. K. T. Oldring—1991—ISBN 0 947798102. Particularly preferred are urethane(meth)acrylate multifunctional monomers, which can be used alone or in combination with other (meth) acrylate multifunctional monomers.

The photopolymerizable composition may also comprise a co-initiator. Typically, a co-initiator is used in combination with a free radical initiator and/or cationic initiator.

Particular co-initiators, as described in EP 107 792, may be present in the photopolymerizable layer to further increase the sensitivity. Preferred co-initiators are sulfur-compounds, especially thiols like e.g. 2-mercaptobenzothiazole, 2-mercaptobenzoxazole or 2-mercapto-benzimidazole.

Other preferred co-initiators are polythiols as disclosed in WO2006/048443 and WO2006/048445. These polythiols may be used in combination with the above described thiols, e.g. 2-mercaptobenzthiazole.

Other co-initiators are the co-initiators as disclosed in U.S. Pat. No. 6,410,205, U.S. Pat. No. 5,049,479, EP 1079276, EP 1369232, EP 1369231, EP 1341040, US 2003/0124460, EP 1241002, EP 1288720 and in the reference book including the cited references: Chemistry & Technology UV & EB formulation for coatings, inks & paints—Volume 3—Photoinitiators for Free Radical and Cationic Polymerisation by K. K. Dietliker—Edited by P. K. T. Oldring—1991—ISBN 0 947798161.

The amount of co-initiator generally ranges from 0.01 to 10% by weight, preferably from 0.1 to 2% by weight relative to the total weight of the non volatile components of the photopolymerizable composition.

The Sensitizer

The photopolymerisable composition may also comprise a sensitizer. Highly preferred sensitizers are violet light absorbing sensitizers, having an absorption spectrum between 350 nm and 450 nm, preferably between 370 nm and 420 nm, more preferably between 390 nm and 415 nm. Particular preferred sensitizers are disclosed in EP 1 349 006 paragraph [0007] to [0009], EP-A-3103499, filed on 22 Sep. 2003, and WO2004/047930, including the cited references in these patent applications. Other highly preferred sensitizers are infrared light absorbing dyes, having an absorption spectrum between 750 nm and 1300 nm, preferably between 780 nm and 1200 nm, more preferably between 800 nm and 1100 nm. Particular preferred sensitizers are heptamethinecyane dyes, specially the dyes disclosed in EP 1 359 008 paragraph [0030] to [0032]. Other preferred sensitizers are blue, green or red light absorbing sensitizers, having an absorption spectrum between 450 nm and 750 nm. Useful sensitizers can be selected from the sensitizing dyes disclosed in U.S. Pat. No. 6,410,205, U.S. Pat. No. 5,049,479, EP 1 079 276, EP 1 369 232, EP 1 369 231, EP 1 341 040, US 2003/0124460, EP 1 241 002 and EP 1 288 720.

The Binder

The binder of the photopolymerizable layer may be selected from a wide series of organic polymers or co-polymers. Also a mixture of two or more different polymers or co-polymers may be used.

Suitable polymers to be used as binder may include (meth) acrylic resins, polyvinyl acetal resins, polyurethane resins, polyamide resins, epoxy resins, polystyrene resins and polyester resins.

Preferred polymers or co-polymers usable as binder are disclosed in WO2005/111727 (page 17 ln. 21 to page 20 ln. 3) and WO2005/029187 (page 16 ln. 26 to page 18 ln. 11).

Preferred binders contain an acid group such as a carboxyl group, a sulfone group or a phosphate group. Particularly preferred and well known are polymers or co-polymers containing carboxyl groups, in particular polymers or co-polymers containing monomeric units of $\alpha,\beta$-unsaturated carboxylic acids and/or monomeric units of $\alpha,\beta$-unsaturated dicarboxylic acids. Specific examples are polymers or co-polymers of acrylic acid, methacrylic acid, crotonic acid, vinylacetic acid, maleic acid or itaconic acid. Preferred binders have an acid number, expressed as mg KOH/g polymer, of from 10 to 250, preferably from 20 to 200.

Other preferred binders are (meth)acrylic acid ester co-polymers, such as a co-polymer of a (meth)acrylic acid alkyl or aralkyl ester with a (meth)acrylic acid ester containing a —$CH_2$—$CH_2$—O— or —$CH_2$—$CH_2$—NH— unit in R of the ester residue (—COOR) of the (meth)acrylic ester. The alkyl group in the (meth)acrylic acid alkyl ester is preferably an alkyl group having from 1 to 5 carbon atoms, more preferably a methyl group. Preferred examples of the (meth) acrylic acid aralkyl ester include benzyl(meth)acrylate.

The binder preferably comprises hydrophilic groups, e.g. a hydroxyl group, a carboxylate group, a hydroxyethyl group, an ethyleneoxy group, an aminopropyl group, an ammonium group, an amido group or a carbomethyl group.

A hydrophilic polymer may be added to the photopolymerizable layer to enhance the developability. Suitable examples of the hydrophilic polymer include those having a hydrophilic group such as a hydroxyl group, a carboxyl group, a carboxylate group, a hydroxyethyl group, a polyoxyethyl group, a hydroxypropyl group, a polyoxypropyl group, an amino group, an aminoethyl group, an aminopropyl group, an ammonium group, an amide group, a carboxymethyl group, a sulfonic acid group and a phosphoric acid group. Specific examples thereof include gum arabic, casein, gelatin, starch derivatives, carboxymethylcellulose and sodium salts thereof, cellulose acetate, sodium alignate, cinul acetate-maleic acid co-polymers, tyrene-maleic acid co-polymers, polyacrylic acids and salts thereof, poly(meth)acrylic acids and salts thereof, homopolymers and co-polymers of hydroxyethyl(meth)acrylate, homopolymers and co-polymers of hydroxypropyl(meth)acrylate, homopolymers and co-polymers of hydroxybutyl(meth)acrylate, polyethylene glycols, hydroxypropylene polymers, polyvinyl alcohols, hydrolyzed polyvinyl acetates, polyvinyl formal, polyvinyl butyral, polyvinyl pyrrolidone, homopolymers and polymers of (meth) acrylamide. The hydrophilic polymer preferably has a weight average molecular weight of 5 000 or more, more preferably from 10 000 to 300 000. The hydrophilic polymer may be a random polymer, a block polymer or a graft polymer. The content of the hydrophilic polymer in the image-recording layer is preferably 20 percent by weight or less, more preferably 10 percent by weight or less, relative to the entire solid content of the image-recording layer.

Particularly preferred hydrophilic binders are those disclosed in the unpublished EP-A 06 120 509 wherein the hydrophilic binder is a polymer having at least 1 mol percent of a monomeric unit capable of interacting with the support and at least 30 mol percent of a hydrophilic monomeric unit. In EP-A 06 120 509 the hydrophilic binder is used in combination with a non-polymeric adhesion promoting compound, said compound comprising a group capable of interacting with the aluminum surface. The hydrophilic polymer and the adhesion promoting compound may also be incorporated in an intermediate layer, positioned between the support and the image-recording layer.

Particular suitable binders are copolymers of vinylacetate and vinylalcohol, preferably comprising vinylalcohol in an amount of 10 to 98 mol % vinylalcohol, more preferably between 35 and 95 mol %, most preferably 40 and 75 mol %, best results are obtained with 50 to 65 mol % vinylalcohol. The ester-value, measured by the method as defined in DIN 53 401, of the copolymers of vinylacetate and vinylalcohol ranges preferably between 25 and 700 mg KOH/g, more preferably between 50 and 500 mg KOH/g, most preferably between 100 and 300 mg KOH/g. The viscosity of the copolymers of vinylacetate and vinylalcohol are measured on a 4 weight % aqueous solution at 20° C. as defined in DIN 53 015 and the viscosity ranges preferably between 3 and 60 mPa·s, more preferably between 4 and 30 mPa·s, most preferably between 5 and 25 mPa·s. The average molecular weight $M_w$ of the copolymers of vinylacetate and vinylalcohol ranges preferably between 5 000 and 500 000 g/mol, more preferably between 10 000 and 400 000 g/mol, most preferably between 15 000 and 250 000 g/mol.

Other particular preferred binders are co-polymers of vinylacetals, vinylacetate and vinylalcohol. These co-polymers may be prepared starting from polyvinylacetates: the polyvinylacetate is first partially hydrolyzed to form a co-polymer of vinylacetate and vinylalcohol, followed by a partially acetylization of the vinylalcohol by reaction with an aldehyde. The most common aldehydes are formaldehyde and butyraldehyde resulting in vinylformal or vinylbutyral, preferably vinylbutyral. The vinylbutyral monomers are hydrophobic while the vinylalcohol and/or vinylacetate monomers are hydrophilic. The hydrophobicity of the binder may influence the ink acceptance and the run length while the hydrophilicity of the binder may influence the developability, especially when development is carried out on press or in a gum solution. By adjusting the ratio vinylbutyral versus vinylalcohol and vinylacetate, the hydrophobicity-hydrophilicity of the binder may be optimized. A partial esterification of the co-polymer with polycarboxylic acids, e.g. trimellit acid, may introduce carboxylic acid groups into the co-polymer to further optimize the hydrophobicity-hydrophilicity of the binder.

According to a highly preferred embodiment of the present invention, the photopolymerizable layer comprises a polymer which contains an acid group and a basic nitrogen-containing compound capable of neutralizing said acid group or a polymer which contains an acid group which is neutralised with a basic nitrogen-containing compound.

Said basic nitrogen-containing compound preferably has an amino group, an amidine group or a guanidine group. Said amino group is preferably a tertiary amino group. Said amino group may contain an aromatic or heterocyclic group, which may be monocyclic, bicyclic or tricyclic, such as a phenyl group, a benzyl group, a naphtyl group, or a group derived from pyridine, pyrimidine, triazine, oxazine, pyrrole, thiophene, furan, triazole, oxazole, indene, indole, benzofuran, benzoxazole, anthracene, fluorene or carbazole, optionally each of them being substituted. In another preferred embodiment, said basic nitrogen-containing compound further comprises a group having an ethylenically unsaturated bond. Said group having an ethylenically unsaturated bond is most preferably a vinyl group or a (meth)acrylate group.

Examples of basic nitrogen-containing compounds are
N,N-dimethyl amino ethyl(meth)acrylate,
N,N-dimethyl amino propyl(meth)acrylate,
N,N-diethyl amino propyl(meth)acrylate,
N,N-diethyl amino ethyl(meth)acrylate,
N,N-diethyl amino propyl(meth)acrylamide,
N,N-dimethyl amino ethyl-N'-(meth)acryloyl carbamate,
N,N-diethyl amino-ethoxyethyl(meth)acrylate,
t-butyl amino ethyl(meth)acrylate,
N,N-diethyl amino ethanol,
N,N-dimethyl aniline,
N,N-dimethyl amino ethoxy ethanol,
2-amino-2-ethyl-1,3-propanediol,
tetra(hydroxy ethyl)ethylene diamine,
tetramethyl hexane diamine,
tetramethyl butane diamine,
triethanol amine,
triethyl amine,
2-N-morpholino ethanol,
2-piperidino ethanol,
N-methyl amino ethanol,
N,N-dimethyl amino ethanol,
N-ethyl amino ethanol,
N,N,N-butyl amino diethanol,
N,N-dimethyl amino ethoxy ethanol,
N,N-diethyl amino ethoxy ethanol,
N,ethanol amine,
N,N-diethanol amine,
N,N,N-triethanol amine,
N-methyl diethanol amine,
N,N,N-tri-isopropanol amine,
N,N-dimethyl dihydroxypropyl amine,
N,N-diethyl dihydroxypropyl amine,
N-methyl-glucamine,
Piperazine,
Methylpiperazine,
N-hydroxyethylpiperazine,
N-hydroxyethylpiperazine,
N,N-dihydroxyethylpiperazine or
N-hydroxyethylpiperidine.

Of these nitrogen-containing compounds less volatile compounds are preferred to avoid odor nuisance.

Said polymer which contains an acid group is a polymer which comprises a monomeric unit having in the side chain an acid group. Said acid group is preferably a carboxylic acid group, a sulphonic acid group, an imide group or a primary (i.e. —$SO_2$—$NH_2$) or secondary (i.e. —$SO_2$—NH—) sulphonamide group. Said polymer which contains an acid group is preferably a polymer or copolymer of (meth)acrylic acid, maleic acid, itaconic acid or a (meth)acryl amide.

The basic nitrogen-containing compound may be added previously to the polymer which contains an acid group whereby the acid group is neutralised by the basic nitrogen-containing compound, resulting in the formation of a salt of the acid and the base, and this polymer is added to the solution for coating the photopolymerizable layer. In the salt formation the acid and the base are mainly ionically bond to each other. In an alternative way, the polymer which contains an acid group and the basic nitrogen-containing compound may be both added to the solution for coating the photopolymerizable layer. The ratio of the amount of basic nitrogen-containing compound to the amount of acid groups present in the polymer may vary from 1 to 100 mol %, preferably from 5 to 100 mol %, more preferably from 10 to 100 mol %, most preferably from 20 to 100%.

In another embodiment, the basic nitrogen-containing compound may be added in excess to the amount of acid groups present in the polymer. In this embodiment, the ratio of the amount of basic nitrogen-containing compound to the amount of acid groups present in the polymer may range between 1 to 200 mol %, preferably between 50 to 200 mol %, more preferably between 100 to 200 mol %, most preferably between 110 to 200 mol %. The presence of an excess of the basic nitrogen-containing compound may improve the developability of the printing plate precursor and may also improve the stability of the pH of the gum solution during processing.

The binder may also comprise a crosslinkable functional group in the main chain or a side chain. A crosslinkable group is capable of crosslinking the polymeric binder upon exposure. The crosslinkable functional group may be an ethylenically unsaturated group, an amino group, an epoxy group, a thiol group, a halogen atom or an onium salt. Preferably, the polymeric binder contains an ethylenically unsaturated group. Examples of suitable crosslinkable binders are discloses in EP 1 748 317 (paragraph [0075] to [0084]). The content of the crosslinkable group (content of radical-polymerizable unsaturated double bond determined by iodine titration) in the binder polymer is preferably from 0.1 to 10.0 mmol, more preferably from 1.0 to 7.0 mmol, and most preferably from 2.0 to 5.5 mmol, per g of binder polymer. The crosslinking property of the binder may increase the durability of the image-areas of the printing plate and therefore improve the run length.

The organic polymers used as binders have a typical mean molecular weight $M_W$ between 600 and 200 000, preferably between 1 000 and 100 000.

The amount of binder(s) generally ranges from 10 to 90% by weight, preferably 20 to 80% by weight, relative to the total weight of the non-volatile components of the composition.

The total amount of the polymerizable compounds relative to the total amount of binder is preferably from 4.0 to 0.5, more preferably from 2.0 to 1.0.

The Contrast Dye

The coating of the lithographic printing plate may further comprise a colorant. The colorant can be a dye or a pigment. After development with a gum solution or with an alkaline developer, at least part of the colorant remains in the hardened coating areas and provides a visible image, enabling an examination of the lithographic image on the developed printing plates. Preferred dyes and/or pigments are disclosed in WO 2005/111727. Highly preferred pigments are predispersed phthalocyanine. Their amount generally ranges from about 1 to 15% by weight, preferably from about 2 to 7% by weight, with respect to the total weight of the non-volatile compounds in the photosensitive composition. Particularly suitable predispersed phthalocyanine pigments are disclosed in DE 199 15 717 and DE 199 33 139. Preference is given to metal-free phthalocyanine pigments.

The photopolymerizable composition may also comprise compounds that undergo discoloration or coloration upon exposure with violet light. Compounds that undergo discoloration or coloration by radicals or acids, generated by the violet exposure, are preferred. Especially for the on-press processing embodiment of this invention, such compounds give rise to a print-out image enabling inspection of the image to be printed. Various dyes may be used for this purpose, e.g. diphenylmethane, triphenylmethane, thiazine, oxazine, xanthene, anthraquinone, iminoquinone, azo and azomethine dyes.

Other Ingredients

The photopolymerizable composition may further comprise other ingredients such as for example surfactants, polymerization inhibitors, plasticizers, inorganic particles, low molecular weight hydrophilic compounds.

Preferred inhibitors for use in the photopolymer coating are disclosed in U.S. Pat. No. 6,410,205, EP 1 288 720 and WO2005/109103. Various surfactants may be added to the photopolymerizable layer. Both polymeric and small molecule surfactants can be used. Nonionic surfactants are preferred. Preferred nonionic surfactants are polymers and oligomers containing one or more polyether segments (such as polyethylene glycol, polypropylene glycol, and copolymer of ethylene glycol and propylene glycol). Examples of preferred nonionic surfactants are block copolymers of propylene glycol and ethylene glycol (also called block copolymer of propylene oxide and ethylene oxide); ethoxylated or propoxylated acrylate oligomers; and polyethoxylated alkylphenols and polyethoxylated fatty alcohols. The nonionic surfactant is preferably added in an amount ranging between 0.1 and 30% by weight of the coating, more preferably between 0.5 and 20%, and most preferably between 1 and 15%.

The Overcoat

The precursor used in the methods of this invention comprises on top of the photopolymerizable coating a top layer which acts as an oxygen-barrier layer and which comprises a water-soluble or water-swellable polymer. Said barrier layer is hereinafter also referred to as "overcoat layer" or "overcoat" or "toplayer".

In accordance with the present invention, said overcoat layer comprises an acid which is water soluble and has a low molecular weight. Said acid may be an inorganic acid such as HCL, HBr, HI, HF, sulphuric acid, nitric acid, phosphoric acid or phosphorous acid. Said acid may also be an organic acid selected from an aliphatic or aromatic hydrocarbon having at least one acid group, optionally two or three acid groups. The acid group may be selected from a carboxylic acid group, a sulphonic acid group or a phosphonic acid group; a carboxylic acid group is preferred. The aliphatic or hydrocarbon has preferably 1 to 18 carbon atoms, more preferably 1 to 12 carbon atoms, most preferably 1 to 8 carbon atoms. Examples of such acids are: acetic acid, formic acid, citric acid, para-toluene sulphonic acid, benzoic acid, phthalic acid, salicylic acid, trimelitic acid, lactic acid, adipinic acid, glutaric acid, succinic acid, malic acid, malonic acid, oxalic acid, aldanic acid, tartaric acid, acetoacetic acid, pyruvic acid, lauric acid, butyric acid, acrylic acid, methacrylic acid, pelargonic acid, enantic acid, valeric acid and propionic acid.

Said acid is preferably present in said overcoat layer in an amount of at least $0.001$ g/m$^2$, more preferably at least $0.005$ g/m$^2$, most preferably at least $0.01$ g/m$^2$.

The overcoat layer preferably comprises a hydrophilic polymer binder. Preferred binders which can be used in the top layer are disclosed in WO2005/029190 (page 36 line 3 to page 39 line 25), US 2007/0020563 (paragraph [0158]) and EP 1 288 720 (paragraphs [0148] and [0149]). The most preferred binder for the toplayer is polyvinylalcohol. The polyvinylalcohol has preferably a hydrolysis degree ranging between 74 mol % and 99 mol %. The weight average molecular weight of the polyvinylalcohol can be determined by measuring the viscosity of a 4% by weight aqueous solution at 20° C., as defined in DIN 53 015. This viscosity number ranges preferably between 3 and 26, more preferably between 3 and 15, most preferably between 3 and 10. Preferably, a mixture of polyvinylalcohols having a different hydrolysis and viscosity number are used.

Modified polyvinylalcohols, e.g. polyvinylalcohols having a carboxyl group and/or a sulphonic acid group may also be used, preferably together with unmodified polyvinylalcohols.

The coating thickness of the top layer is preferably between $0.25$ and $1.75$ g/m$^2$, more preferably between $0.30$ and $1.30$ g/m$^2$, most preferably between $0.40$ and $1.00$ g/m$^2$. In a most preferred embodiment of the present invention, the top layer has a coating thickness between $0.25$ and $1.75$ g/m$^2$ and comprises a polyvinylalcohol having a hydrolysis degree ranging between 74 mol % and 99 mol % and a viscosity number as defined above ranging between 3 and 26.

Besides acting as barrier for oxygen, the overcoat layer must be easily removable during processing and be sufficiently transparent for the actinic radiation, e.g. from 300 to 450 nm or from 700 to 900 nm or from 750 to 1200 nm.

The overcoat layer may comprise other ingredients such as anionic surfactants, e.g. sodium alkyl sulphate or sodium alkyl sulphonate; amphoteric surfactants, e.g. alkylaminocarboxylate and alkylamino-dicarboxylate; non-ionic surfactants, e.g. polyoxyethylene alkyl phenyl ether; the additives, e.g. alkoxylated alkylene diamines, disclosed in EP 1 085 380 (paragraph [0021] and [0022]); glycerine, inorganic particles, pigments, etc.

The Intermediate Layer—Adhesion Promoting Compound

The optional intermediate layer may comprise adhesion promoting compounds. These adhesion promoting compounds may however also be incorporated in the photopolymerizable layer. The adhesion promoting compound is preferably a compound capable of interacting with said support, e.g. a compound having an addition polymerizable ethylenically unsaturated bond and a functional group capable of interacting with the support, more preferably a functional group capable of interacting with a grained and anodized aluminum support. Under "interacting" is understood each type of physical and/or chemical reaction or process whereby, between the functional group and the support, a bond is formed which can be a covalent bond, an ionic bond, a complex bond, a coordinate bond or a hydrogen-bridge bond, and which can be formed by an adsorption process, a chemical reaction, an acid-base reaction, a complex-forming reaction or a reaction of a chelating group or a ligand. The adhesion promoting compound may be selected from at least one of the low molecular weight compounds or polymeric compounds as described in EP-A 851 299 from lines 22 on page 3 to line 1 on page 4, EP-A 1 500 498 from paragraph [0023] on page 7 to paragraph [0052] on page 20, EP-A 1 495 866 paragraph [0030] on page 5 to paragraph [0049] on page 11, EP-A 1 091 251 from paragraph [0014] on page 3 to paragraph [0018] is on page 20, and EP-A 1 520 694 from paragraph [0023] on page 6 to paragraph [0060] on page 19. Preferred compounds are those compounds which comprise a phosphate or phosphonate group as functional group capable of adsorbing on the aluminum support and which comprise an addition-polymerizable ethylenic double bond reactive group, especially those described in EP-A 851 299 from lines 22 on page 3 to line 1 on page 4 and EP-A 1 500 498 from paragraph [0023] on page 7 to paragraph [0052] on page 20. Also preferred are those compounds comprising tri-alkyl-oxy silane groups, hereinafter also referred to as "trialkoxy silane" groups, wherein the alkyl is preferably methyl or ethyl, or wherein the trialkoxy silane groups are at least partially hydrolysed to silanol groups, as functional group capable of adsorbing on the support, especially silane coupling agents having an addition-polymerizable ethylenic double bond reactive group as described in EP-A 1 557 262 paragraph [0279] on page 49 and EP-A 1 495 866 paragraph [0030] on page 5 to paragraph [0049] on page 11. The adhesion promoting compound may be present in the photopolymerizable layer in an amount ranging between 1 and 50% by weight, preferably between 3 and 30% by weight, more preferably between 5 and 20% by weight relative to the total amount of the non-volatile components of the composition. The adhesion promoting compound may be present in the intermediate layer in an amount of at least 50% by weight, preferably at least 80% by weight, more preferably at least 90% by weight, most preferably 100% by weight relative to the total amount of the non-volatile components of the composition. The optionally intermediate layer has a coating thickness preferably ranging between 0.001 and 1.5 g/m$^2$, more preferably between 0.003 and 1.0 g/m$^2$, most preferably between 0.005 and 0.7 g/m$^2$.

Exposure

The image-wise exposing step is carried out off-press in a plate setter, i.e. an exposure apparatus suitable for image-wise exposing the precursor by a laser such as a laser diode, emitting around 830 nm, a NdYAG laser, emitting around 1060 nm, a violet laser, emitting around 400 nm, or a gas laser such as Ar laser, or by a digital modulated UV-exposure, e.g. by means of digital mirror devices, or by a conventional exposure in contact with a mask.

In a preferred embodiment of the present invention, the precursor is image-wise exposed by a laser emitting IR-light.

In a more preferred embodiment of the present invention, the precursor is image-wise exposed by a laser emitting violet light. This laser emits light having a wavelength of preferably from 300 to 450 nm, more preferably of from 350 to 420 nm and this light preferably has an energy density measured on the surface of the plate of 100 µJ/cm$^2$ or less. Preferably laser diodes, highly preferred commercially available InGaN-based semiconductor laser diodes having a wavelength of about 405 nm (+ or −15 nm), are used to expose the lithographic printing plate precursors. The power of the laser diodes may be between 5 and 200 mW, preferably between 20 mW and 150 mW, most preferably between 50 mW and 80 mW. One laser diode may be used to expose the lithographic printing plate precursors, but also multiple laser diodes may be used.

Three major categories of plate-setters, i.e. apparatuses wherein the lithographic printing plates are image-wise exposed with a laser beam, are known and may be used in the present invention: flat bed, internal drum (ITD) and external drum (XTD) type plate-setters.

A particularly preferred plate-setter, an external drum apparatus emitting one or more scanning laser beams having a wavelength between 390 and 420 nm and an energy density, measured on the surface of the precursor, of 100 µJ/cm$^2$ or less, and a method of preparing a printing plate using the plate-setter is disclosed in the unpublished EP-A 06 112 161 (filed 2006 Apr. 3). The pixel dwell time of the scanning laser beam is preferably from 0.5 to 10 microseconds.

Also suitable is the apparatus described in US2006/0001849 comprising an imaging head comprising a plurality of laser diodes emitting light of a wavelength between 350 nm and 450 nm. Since each spot on the lithographic printing plate to be exposed receives light, emitted from a plurality of laser diodes, low power laser diodes can be used.

The method disclosed in WO2005/111717 comprising image-wise exposing a photopolymerizable lithographic printing plate precursor with an imaging time per pixel of 1 milliseconds or less using a laser light with an emission wavelength of from 250 nm to 420 nm may also be used in the present invention.

Pre-Heat

The lithographic printing plate precursors are optionally subjected to a pre-heat step. In such a pre-heat step, performed after image-wise exposure and before development, the plate precursor is heated to enhance or to speed-up the polymerization and/or crosslinking reaction. The pre-heat step may improve the printing properties, e.g. rendition of small dots or run length, of the printing plate. There is no particular time limit between exposure and pre-heat but the pre-heat step is usually carried out within a time period after exposure of less than 10 minutes, preferably less than 5 minutes, more preferably less than 1 minutes, most preferably the pre-heat is carried out immediately after the image-wise exposing, i.e. within less than 30 seconds. In this heating step, the precursor is heated at a temperature of preferably 80° C. to 150° C., more preferably of 90 to 140° C., most preferably of 100° C. to 130° C. during preferably 1 seconds to 1 minute, more preferably 5 seconds to 45 seconds, most preferably 10 seconds to 30 seconds. The pre-heating unit is preferably provided with heating elements such as IR-lamps, UV-lamps, heated air, a heated metal roll, etc.

The pre-heating unit is preferably connected with the development apparatus to enable automatic transport from the pre-heating unit to the development apparatus in a single apparatus. Preferably a cooling section is provided between the pre-heating section and the development section of said single apparatus.

The pre-heating unit, the development unit may also be connected to the plate-setter to enable automatic transport of the exposed precursor to first the pre-heating unit and then the developing unit. Again, a cooling section may be provided between the pre-heating unit and the development unit.

Development Off-Press by a Gum Solution

In an embodiment of the present invention, the precursor, after image-wise exposing and optionally preheating, is processed and gummed by applying a gum solution and optionally brushing the precursor, thereby removing at least part of the coating in the non-exposed areas and gumming the plate in one single step. It is important that the coating, remaining on the plate in the non-exposed areas after processing with the gum solution, is capable of being further removed on the press with fountain and ink during the start-up of the printing process, such that the number of sheets necessary to cleanup these hydrophilic areas is as low as possible, preferably lower that 25 sheets, and that no toning appears during the press run. It is also important that the coating remaining on the plate in the non-exposed areas after processing with the gum solution is as low as possible in order to obtain an image on the plate with a sufficient image contrast, whereby the difference in optical density in the exposed (hardened) printing areas and in the non-exposed, non-printing areas is as high as possible. A high image contrast has the advantage that the plate and especially the image quality of the plate can be inspected before mounting the plate on the press and starting the printing process. In a preferred embodiment of the present invention, the coating in the non-exposed areas is as low as possible and is capable of being further removed on the press with fountain and ink during the start-up of the printing process. In a more preferred embodiment of the present invention, the coating in the non-exposed areas is completely removed by applying a gum solution and optionally brushing the precursor.

The gum solution in the processing and gumming step can be performed at room temperature or at elevated temperatures, e.g. between 25 and 50° C. The processing and gumming can be carried on until the gum solution is exhausted and has to be replaced by a fresh gum solution or the gum solution is constantly regenerated by adding fresh gum solution as a function of the amount of printing plate precursors developed. The gum solution, used for regeneration, can be of the same or different, preferably higher, concentration. In the method of making a printing plate according to the present invention, the processing and gumming step may comprise a prewash step as disclosed in the EP 1 788 450. In this method development comprises washing the precursor in a prewashing station by applying water or an aqueous solution to the coating, thereby removing at least part of the toplayer, followed by development of the precursor in a gumming station by applying a gum solution to the coating of the precursor, thereby removing the non-exposed areas of the photopolymerizable layer from the support and gumming the plate in a single step. The development step of this invention may also comprise two gumming steps as disclosed in EP 1 788 441 and EP 1 788 444. EP 1 788 441 describes a development carried out in a gumming station, said gumming station comprises a first and at least a second gumming unit, wherein the precursor is washed in the first gumming unit by applying a gum solution to the coating, thereby removing at least part of the top layer, and wherein, subsequently, the precursor is developed in the second gumming unit with a gum solution, thereby removing non-exposed areas of the photopolymerizable layer from the support and gumming the plate in a single step. EP 1 788 444 describes a development carried out in a gumming station, comprising a first and at least a second gumming unit, wherein the precursor is consecutively developed in said first and said second gumming unit with a gum solution, thereby removing non-exposed areas of the photopolymerizable layer from the support and gumming the plate in a single step.

The Gum Solution

A gum solution is typically an aqueous liquid which comprises one or more surface protective compounds that are capable of protecting the lithographic image of a printing plate against contamination, e.g. by oxidation, fingerprints, fats, oils or dust, or damaging, e.g. by scratches during handling of the plate. Suitable examples of such compounds are film-forming hydrophilic polymers or surfactants. The layer that remains on the plate after treatment with the gum solution preferably comprises between 0.005 and 20 g/m$^2$ of the surface protective compound, more preferably between 0.010 and 10 g/m$^2$, most preferably between 0.020 and 5 g/m$^2$. This layer of surface protective compound remaining on the plate has the advantage that, before mounting the plate on the press and starting the printing process, the plate needs no additional step of rinsing, because, by rinsing the plate, this layer of surface protective compound will be removed, resulting in the necessity of an additional gumming step to protect the plate again.

In the present description, all concentrations of compounds present in the gum solution are expressed as percentage by weight (wt. % or % w/w) relative to the ready-to-use gum solution, unless otherwise indicated. A gum solution may be normally supplied as a concentrated solution which is diluted by the end user with water to a ready-to-use gum solution before use according to the instructions of the supplier, usually 1 part of the gum is diluted with 1 part to 10 parts of water.

Preferred polymers for use as protective compound in the gum solution are gum arabic, pullulan, cellulose derivatives such as carboxymethylcellulose, carboxyethylcellulose or methylcellulose, (cyclo)dextrin or a patotoe dextrine (e.g. Tackidex DF165 dextrine), poly(vinyl alcohol), poly(vinyl pyrrolidone), polysaccharide, homo- and copolymers of acrylic acid, methacrylic acid or acrylamide, a copolymer of vinyl methyl ether and maleic anhydride, a copolymer of vinyl acetate and maleic anhydride or a copolymer of styrene and maleic anhydride. Highly preferred polymers are homo- or copolymers of monomers containing carboxylic, sulfonic or phosphonic groups or the salts thereof, e.g. (meth)acrylic acid, vinyl acetate, styrene sulfonic acid, vinyl sulfonic acid, vinyl phosphonic acid or acrylamidopropane sulfonic acid.

Examples of surfactants for use as surface protective agent include anionic or nonionic surfactants. The gum solution may also comprise one or more of the above hydrophilic polymers as surface protective agent and, in addition, one or more surfactants to improve the surface properties of the coated layer. The surface tension of the gum solution is preferably from 20 to 50 mN/m.

The gum solution comprises preferably an anionic surfactant, more preferably an anionic surfactant whereof the anionic group is a sulphonic acid group.

Examples of the anionic surfactant include aliphates, abietates, hydroxyalkanesulfonates, alkanesulfonates, alkanesulfates, dialkylsulfosuccinates, straight-chain alkylbenzenesulfonates, branched alkylbenzenesulfonates, alkylnaphthalenesulfonates, alkylphenoxypolyoxyethylenepropylsulfonates, salts of polyoxyethylene alkylsulfophenyl ethers, sodium N-methyl-N-oleyltaurates, monoamide disodium N-alkylsulfosuccinates, petroleum sulfonates, sulfated castor oil, sulfated tallow oil, salts of sulfuric esters of aliphatic alkylesters, salts of alkylsulfuric esters, sulfuric esters of polyoxyethylenealkylethers, salts of sulfuric esters of aliphatic monoglycerides, salts of sulfuric esters of polyoxyethylenealkylphenylethers, salts of sulfuric esters of polyoxyethylenestyrylphenylethers, salts of alkylphosphoric esters, salts of phosphoric esters of polyoxyethylenealkylethers, salts of phosphoric esters of polyoxyethylenealkylphenylethers, partially saponified compounds of styrenemaleic anhydride copolymers, partially saponified compounds of olefin-maleic anhydride copolymers, and naphthalenesulfonateformalin condensates. Particularly preferred among these anionic surfactants are dialkylsulfosuccinates, salts of alkylsulfuric esters and alkylnaphthalenesulfonates.

Specific examples of suitable anionic surfactants include sodium dodecylphenoxybenzene disulfonate, the sodium salt of alkylated naphthalenesulfonate, disodium methylene-di-naphthalene-disulfonate, sodium dodecyl-benzenesulfonate, sulfonated alkyl-diphenyloxide, ammonium or potassium perfluoroalkylsulfonate, sodium octyl sulphate and sodium dioctyl-sulfosuccinate.

Suitable examples of the nonionic surfactants include polyoxyethylene alkyl ethers, polyoxyethylene alkyl aryl ethers wherein the aryl group may be a phenyl group, a naphthyl group or an aromatic heterocyclic group, polyoxyethylene polystyryl phenyl ethers, polyoxyethylene polyoxypropylene alkyl ethers, polyoxyethylene polyoxypropylene block polymers, partial esters of glycerinaliphatic acids, partial esters of sorbitanaliphatic acid, partial esters of pentaerythritolaliphatic acid, propyleneglycolmonoaliphatic esters, partial esters of sucrosealiphatic acids, partial esters of polyoxyethylenesorbitanaliphatic acid, partial esters of polyoxyethylenesorbitolaliphatic acids, polyethyleneglycolaliphatic esters, partial esters of poly-glycerinaliphatic acids, polyoxyethylenated castor oils, partial esters of polyoxyethyleneglycerinaliphatic acids, aliphatic diethanolamides, N,N-bis-2-hydroxyalkylamines, polyoxyethylene alkylamines, triethanolaminealiphatic esters, and trialkylamine oxides. Particularly preferred among these nonionic surfactants are polyoxyethylene alkylphenyl ethers, polyoxyethylene alkylnaphthyl ethers and polyoxyethylene-polyoxypropylene block polymers. Further, fluorinic and siliconic anionic and nonionic surfactants may be similarly used.

Two or more of the above surfactants may be used in combination. For example, a combination of two or more different anionic surfactants or a combination of an anionic surfactant and a nonionic surfactant may be preferred. The amount of such a surfactant is not specifically limited but is preferably from 0.01 to 30 wt. %, more preferably from 0.05 to 20 wt. %.

The presence of surfactants in the gum solution may improve the developing of the lithographic printing plate precursor and this may result in an improved sensitivity and shelf-life of the plate precursor. Furthermore, the presence of surfactants may results in an improved clean-out of the substrate and this may result in an improved lithographic performance of the plate.

According to the present invention the gum solution has a pH-value preferably between 3 and 9, more preferably between 4.5 and 8.5, even more preferably between 5.5 and 8 and most preferably between 6 and 7. The pH of the gum solution is usually adjusted with a mineral acid, an organic acid or an inorganic salt in an amount of from 0.01 to 15 wt. %, preferably from 0.02 to 10 wt. %. Examples of the mineral acids include nitric acid, sulfuric acid, phosphoric acid and metaphosphoric acid. Especially organic acids are used as pH control agents and as desensitizing agents. Examples of the organic acids include carboxylic acids, sulfonic acids, phosphonic acids or salts thereof, e.g. succinates, phosphates, phosphonates, sulfates and sulfonates. Specific examples of the organic acid include citric acid, acetic acid, oxalic acid, malonic acid, p-toluenesulfonic acid, tartaric acid, malic acid, lactic acid, levulinic acid, phytic acid and organic phosphonic acid.

The gum solution may further comprise an inorganic salt. Examples of the inorganic salt include magnesium nitrate, monobasic sodium phosphate, dibasic sodium phosphate, nickel sulfate, sodium hexametaphosphate and sodium tripolyphosphate. An alkali-metal dihydrogen phosphate such as $KH_2PO_4$ or $NaH_2PO_4$ is most preferred. Other inorganic salts can be used as corrosion inhibiting agents, e.g. magnesium sulfate or zinc nitrate. The mineral acid, organic acid or inorganic salt may be used singly or in combination with one or more thereof.

The gum solution may comprise preferably a mixture of an anionic surfactant and an inorganic salt. In this mixture the anionic surfactant is preferably an anionic surfactant with a sulphonic acid group, more preferably an alkali-metal salt of a mono- or di-alkyl substituted diphenylether-sulphonic acid, and the inorganic salt is preferably a mono or dibasic phosphate salt, more preferably an alkali-metal dihydrogen phosphate, most preferably $KH_2PO_4$ or $NaH_2PO_4$.

In accordance with another embodiment of the present invention, the gum solution comprising a mixture of an anionic surfactant and an inorganic salt has preferably a pH-value between 3 and 9, more preferably between 4 and 8.5, even more preferably between 5.5 and 8 and most preferably between 6 and 7. Besides the foregoing components, a wetting agent such as ethylene glycol, propylene glycol, triethylene glycol, butylene glycol, hexylene glycol, diethylene glycol, dipropylene glycol, glycerin, trimethylol propane and diglycerin may also be present in the gum solution. The wetting agent may be used singly or in combination with one or more thereof. In general, the foregoing wetting agent is preferably used in an amount of from 1 to 25 wt. %.

Further, a chelate compound may be present in the gum solution. Calcium ion and other impurities contained in the diluting water can have adverse effects on printing and thus cause the contamination of printed matter. This problem can be eliminated by adding a chelate compound to the diluting water. Preferred examples of such a chelate compound include organic phosphonic acids or phosphonoalkanetricarboxylic acids. Specific examples are potassium or sodium salts of ethylenediaminetetraacetic acid, diethylenetriaminepentaacetic acid, triethylenetetraminehexaacetic acid, hydroxyethylethylenediaminetriacetic acid, nitrilotriacetic acid, 1-hydroxyethane-1,1-diphosphonic acid and aminotri (methylenephosphonic acid). Besides these sodium or potassium salts of these chelating agents, organic amine salts are useful. The preferred amount of such a chelating agent to be added is from 0.001 to 5 wt. % relative to the gum solution in diluted form.

Further, an antiseptic and an anti-foaming agent may be present in the gum solution. Examples of such an antiseptic include phenol, derivatives thereof, formalin, imidazole derivatives, sodium dehydroacetate, 4-isothiazoline-3-one derivatives, benzoisothiazoline-3-one, benztriazole derivatives, amidineguanidine derivatives, quaternary ammonium salts, pyridine derivatives, quinoline derivatives, guanidine derivatives, diazine, triazole derivatives, oxazole and oxazine derivatives. The preferred amount of such an antiseptic to be added is such that it can exert a stable effect on bacteria, fungi, yeast or the like. Though depending on the kind of bacteria, fungi and yeast, it is preferably from 0.01 to 4 wt. % relative to the gum solution in diluted form. Further, preferably, two or more antiseptics may be used in combination to exert an aseptic effect on various fungi and bacteria. The anti-foaming agent is preferably a silicone anti-foaming agent. Another preferred antifoaming agent is phenoxypropanol. Among these anti-foaming agents, either an emulsion dispersion type or solubilized type anti-foaming agent may be used. The proper amount of such an anti-foaming agent to be added is from 0.001 to 1.0 wt. % relative to the gum solution in diluted form. ("wt. %" means "% by weight").

In addition to the foregoing ingredients a radical stabilizing compound may be present in the gum. The proper amount of such radical stabilizing compound to be added is from 0.01 to 5 wt % relative to the gum solution in ready-to-used concentration. Typical radical stabilizers are disclosed in EP-A 04 101 955, filed on 6 May 2004.

Besides the foregoing components, an ink receptivity agent may be present in the gum solution if desired. Examples of such an ink receptivity agent include turpentine oil, xylene, toluene, low heptane, solvent naphtha, kerosine, mineral spirit, hydrocarbons such as petroleum fraction having a boiling point of about 120° C. to about 250° C., diester phthalates (e.g., dibutyl phthalate, diheptyl phthalate, di-n-octyl phthalate, di(2-ethylhexyl)phthalate, dinonyl phthalate, didecyl phthalate, dilauryl phthalate, butylbenzyl phthalate), aliphatic dibasic esters (e.g., dioctyl adipate, butylglycol adipate, dioctyl azelate, dibutyl sebacate, di(2-ethylhexyl)sebacate dioctyl sebacate), epoxidated triglycerides (e.g., epoxy soybean oil), ester phosphates (e.g., tricresyl phosphate, trioctyl phosphate, trichloroethyl phosphate) and plasticizers having a solidification point of 15° C. or less and a boiling point of 300° C. or more at one atmospheric pressure such as esters of benzoates (e.g., benzyl benzoate). Examples of other solvents which can be used in combination with these solvents include ketones (e.g., cyclohexanone), halogenated hydrocarbons (e.g., ethylene dichloride), ethylene glycol ethers (e.g., ethylene glycol monomethyl ether, ethylene glycol monophenyl ether, ethylene glycol monobutyl ether), aliphatic acids (e.g., caproic acid, enathic acid, caprylic acid, pelargonic acid, capric acid, undecylic acid, lauric acid, tridecylic acid, myristic acid, pentadecylic acid, palmitic acid, heptadecylic acid, stearic acid, nonadecanic acid, arachic acid, behenic acid, lignoceric acid, cerotic acid, heptacosanoic acid, montanic acid, melissic acid, lacceric acid, isovaleric acid) and unsaturated aliphatic acids (e.g., acrylic acid, crotonic acid, isocrotonic acid, undecyclic acid, oleic acid, elaidic acid, cetoleic acid, erucic acid, butecidic acid, sorbic acid, linoleic acid, linolenic acid, arachidonic acid, propiolic acid, stearolic acid, clupanodonic acid, tariric acid, licanic acid). Preferably, it is an aliphatic acid which is liquid at a temperature of 50° C., more preferably has from 5 to 25 carbon atoms, most preferably has from 8 to 21 carbon atoms. The ink receptivity agent may be used singly or in combination with one or more thereof. The ink receptivity agent is preferably used in an amount of from 0.01 to 10 wt. %, more preferably from 0.05 to 5 wt. %. The foregoing ink receptivity agent may be present as an oil-in-water emulsion or may be solubilized with the aid of a solubilizing agent.

The viscosity of the gum solution can be adjusted to a value of preferably 1.0 to 5 mPa·s, more preferably 1.7 to 5 mPa·s, most preferably 2 to 4.5 mPa·s, by adding viscosity increasing compounds, such as poly(ethylene oxide) or polyvinylalcohol, e.g. having a molecular weight between $10^4$ and $10^7$. Such compounds can be present in a concentration of 0.01 to 10 g/l.

A baking gum has a similar composition as described above, with the additional preference towards compounds that do not evaporate at the usual bake temperatures. Baking gum solutions or baking gumming solutions can be aqueous solutions of sodium dodecyl phenoxy benzene disulphonate, alkylated naphthalene sulphonic acid, sulphonated alkyl diphenyl oxide, methylene dinaphthalene sulphonic acid, etc. Other gumming solutions contain a hydrophilic polymer component and an organic acid component. Still other baking gumming solutions contains the potassium salt of the hydroxyethylidene diphosphonic acid. Still other baking gumming solutions contain a sulphosuccinamate compound and phosphoric acid.

The contact angle between the baking gum solution and the plate is preferably lowered by adding at least one surfactant. Preferred surfactants are non-ionic polyglycols and perfluorated aliphatic polyester acrylates.

The viscosity of the baking gum solution is brought at a value of preferably 1.0 to 5 mPa·s, more preferably 1.7 to 5 mPa·s, most preferably 2 to 4.5 mPa·s, by adding at least one viscosity increasing compound. Preferred viscosity increasing compounds are hydrophilic polymer compounds, more preferably polyethylene oxides. Said polyethylene oxides have preferably a molecular weight between 100,000 and 10,000,000, more preferably between 500,000 and 5,000,000. They are preferably used in a concentration of 0.01 to 10 g/l, more preferably of 0.05 to 5 g/l.

In another embodiment the baking gumming solutions comprises (a) water, (b) at least one hydrophilic polymer and (c) at least one component selected from the group consisting of water soluble organic acids comprising at least two acid functions and being selected form the group consisting of a benzene carboxylic acid, a benzene sulphonic acid, a benzene phosphonic acid, an alkane phosphonic acid and water soluble salts thereof. The mentioned compounds (b) and (c) which are dissolved in the aqueous solution in accordance with the present invention are such that they do not evaporate at the customary baking temperatures. The protective layer which is formed remains water-soluble, even after baking, and can be readily removed without damaging the printing plate.

Component (b) comprises in particular the following hydrophilic polymers: N-polyvinyl-pyrrolidone, polyvinylmethylether, copolymers containing ethylene units and maleic anhydride units, homopolymers or copolymers containing vinyl phosphonic acid units, vinyl methyl phosphinic acid units and/or acrylic acid units and/or a polyalkylene glycol, such as polyethylene glycol.

Component (c) comprises in particular: benzene disulphonic acids, benzene polycarboxylic acids having from 3 to 6 carboxyl groups, alkane diphosphonic acids which having from 1 to 3 carbon atoms in the alkane group, carboxyl group containing alkane diphosphonic acids which have from 5 to 9 carbon atoms in the alkane group, and/or one of the water-soluble salts of these acids (preferably alkali metal salts or ammonium salts). Specific examples of component (c) include benzene-1,3-disulphonic acid, benzene-1,2,4-tricarboxylic acid (trimellitic acid), benzene 1,2,4,5-tetracarboxylic acid (pyromellitic acid), benzene hexacarboxylic acid (mellitic acid), methane diphosphonic acid (diphosphono methane), 4,4-diphosphono-heptane-1,7-dioic acid (3,3-diphosphono-pimeic acid), and the sodium salts of these acids. In other embodiments the baking gumming solution for use can additionally contain hydroxy-polycarboxylic acids, such as citric acid and/or the salts thereof, water soluble alkanediols having at least 4 carbon atoms, such as hexanediol-(1,6) and surfactants (preferably anionic or non-ionic surfactants) such as alkyl aryl sulphonates, alkyl phenol ether sulphonates and a natural surfactant (e.g. Saponin). Specific examples of suitable baking gum solutions, ingredients and concentrations thereof, can be found in e.g. EP-A 222 297, EP-A 1 025 992, DE-A 2 626 473 and U.S. Pat. No. 4,786, 581.

On Press Development.

In an alternative embodiment of the present invention, the precursor, after image-wise exposing and optionally preheating, is processed on-press by mounting the precursor on a plate cylinder of a lithographic printing press and rotating the plate cylinder while feeding dampening liquid and/or ink to the coating, thereby removing non-exposed areas of the coating. The non-exposed areas of the photopolymerizable coating are removed by dissolution or dispersion by the ink and/or the aqueous fountain solution while the exposed areas are substantially not removed by applying ink and/or fountain.

The on press development step may comprise a prewash step as disclosed in the EP 1 788 450. In a prewashing station the precursor is washed by applying water or an aqueous solution to the coating, thereby removing at least part of the toplayer, followed by development of the precursor by mounting the precursor on a plate cylinder of a lithographic printing press and rotating the plate cylinder while feeding dampening liquid and/or ink to the coating.

In still another alternative embodiment of the present invention, the precursor, after image-wise exposing and optionally preheating, is processed and gummed by applying a gum solution and optionally brushing the precursor, thereby removing part of the coating at non-exposed areas and gumming the plate with a gum solution, as defined above, and is further processed on-press by applying ink and/or fountain, as defined above.

EXAMPLES

Preparation of Aluminum Support S-1

A 0.3 mm thick aluminium foil was degreased by spraying with an aqueous solution containing 26 g/l NaOH at 65° C. for 2 seconds and rinsed with demineralised water for 1.5 seconds. The foil was then electrochemically grained during 10 seconds using an alternating current in an aqueous solution containing 15 g/l HCl, 15 g/l $SO_4^{2-}$ ions and 5 g/l $Al^{3+}$ ions at a temperature of 37° C. and a current density of about 80 A/$dm^2$ (charge density of about 800 C/$dm^2$). Afterwards, the aluminium foil was then desmutted by etching with an aqueous solution containing 145 g/l of sulphuric acid at 70° C. for 2 seconds and rinsed with demineralised water for 1 second. The foil was subsequently subjected to anodic oxidation during 15 seconds in an aqueous solution containing 145 g/l of sulfuric acid at a temperature of 50° C. and a current density of 17 A/$dm^2$ (charge density of about 250 C/$dm^2$), then washed with demineralised water for 11 seconds, post-treated for 3 seconds (by spray) with a solution containing 2.2 g/l polyvinyl phosphonic acid at 70° C., rinsed with demineralised water for 1 second and dried at 120° C. for 5 seconds.

The support thus obtained was characterised by a surface roughness Ra of 0.35-0.4 µm (measured with interferometer NT1100) and had an anodic weight of about 3.0 g/$m^2$.

Preparation of Photosensitive Layer P-1

The coating composition for the photosensitive layer P-1 was prepared by mixing the ingredients as specified in Table 1. The resulting solution was coated with a bar-coater at a wet thickness setting of 20 micrometer on support S-1. After coating, the coating was dried for 1 minute at 120° C. in a circulation oven. The resulting applied amount was 1.2 g/$m^2$.

TABLE 1

Composition of the photosensitive layer solution (in g).

| INGREDIENT | P-1 (g) |
|---|---|
| Polymer-1 (1) | 11.85 |
| DMAP-Mam (2) | 3.96 |
| FST 426R (3) | 8.50 |

TABLE 1-continued

Composition of the photosensitive layer solution (in g).

| INGREDIENT | P-1 (g) |
|---|---|
| MONO Z1620 (4) | 30.60 |
| Edaplan LA411 (5) | 0.07 |
| Sensi-1 (6) | 2.92 |
| Heliogen Blue (7) | 5.44 |
| Hostanox 03 (8) | 0.03 |
| HABI (9) | 4.42 |
| MBT (10) | 0.20 |
| Dowanol PM (11) | 578.0 |
| 2-butanone | 354.0 |

(1) Polymer-1 is an esterified copolymer of [vinyl butyral/vinyl alcohol/vinyl acetate], having 64 mol % vinyl butyral, 26 mol % vinyl alcohol, 2 mol % vinyl acetate and 8 mol % trimellit acid ester.
(2) DMAP-Mam is N,N-dimethyl-amino-propyl-methacrylamide.
(3) FST 426R is a solution in 2-butanone containing 88.2% by weight of a reaction product from 1 mole of 2,2,4-trimethyl-hexamethylenediisocyanate and 2 moles of hydroxyethyl-methacrylate (viscosity 3.30 $mm^2$/s at 25° C.).
(4) MONO Z1620 is a solution in 2-butanone containing 30.1 wt. % of a reaction product from 1 mole of hexamethylenediisocyanate, 1 mole of 2-hydroxyethylmethacrylate and 0.5 mole of 2-(2-hydroxyethyl)-piperidine (viscosity 1.7 $mm^2$/s at 25° C.).
(5) Edaplan LA411 is a surfactant, obtained from Munzing Chemie; used as a 1 wt % solution in Dowanol PM.
(6) Sensi-1 is 1,4-di[3,5-dimethoxy-4-isobutoxy-styryl]benzene.
(7) Heliogen Blue is a Heliogene blue D 7490 ® dispersion (9.9 wt. %, viscosity 7.0 $mm^2$/s at 25° C.), trade name of BASF AG, as defined in EP 1 072 956.
(8) Hostanox 03 is a phenolic antioxydant form CLARIANT.
(9) HABI is 2,2'-bis(2-chlorophenyl)-4,4',5,5'-tetraphenyl-1,2-bisimidazole.
(10) MBT is 2-mercaptobenzothiazole.
(11) Dowanol PM is propylene glycol monomethylether, trade mark of Dow Chemical Company.

Preparation of Overcoat Layers OC-01 to OC-11

The coating compositions for the overcoat layers OC-01 to OC-11 were prepared by mixing the ingredients (in g) as specified in Table 2 and 3. The resulting solutions were coated with a bar-coater at a wet thickness setting of 44 micrometer on top of the photosensitive layer P-1 and dried for 2 minutes at 110° C. in a circulation oven. The so-formed protective overcoat layers OC-01 to OC-11 have a dry coating weight of 1.75 g/$m^2$.

TABLE 2

Composition of overcoat solutions OC-01 to OC-05.

| INGREDIENTS | OC-01 | OC-02 | OC-03 | OC-04 | OC-05 |
|---|---|---|---|---|---|
| PVA-1 (1) (g) | 17.05 | 17.05 | 17.05 | 17.05 | 17.05 |
| PVA-2 (2) (g) | 14.80 | 14.80 | 14.80 | 14.80 | 14.80 |
| PVA-3 (3) (g) | 7.45 | 7.45 | 7.45 | 7.45 | 7.45 |
| HCl (3.7 wt. %) (4) (g) | | 0.20 | 0.93 | | |
| HCl (37.0 wt. %) (5) (g) | | | | 0.30 | 0.60 |
| Acticide LA1206 (6) (g) | 0.08 | 0.08 | 0.08 | 0.08 | 0.08 |
| Lupasol p (7) (g) | 0.20 | 0.20 | 0.20 | 0.20 | 0.20 |
| Lutensol A8 (8) (g) | 0.38 | 0.38 | 0.38 | 0.38 | 0.38 |
| Water (g) | 960.0 | 960.0 | 960.0 | 960.0 | 960.0 |

(1) PVA-1 is a partially hydrolyzed polyvinylalcohol (degree of hydrolysis 88%, viscosity 4 mPa · s in a solution of 4 wt. % at 20° C.
(2) PVA-2 is a fully hydrolyzed polyvinylalcohol (degree of hydrolysis 98%, viscosity 6 mPa · s in a solution of 4 wt. % at 20° C.).
(3) PVA-3 is a partially hydrolyzed polyvinylalcohol (degree of hydrolysis 88%, viscosity 8 mPa · s in a solution of 4 wt. % at 20° C.).
(4) HCl (3.7 wt. %) is a solution of HCl, 3.7% by weight in water.
(5) HCl (37.0 wt. %) is a solution of HCl, 37.0% by weight in water.
(6) Acticide LA1206 is a biocide, commercially available from THOR.
(7) Lupasol P is a polyethylene imine, 50% by weight in water, commercially available from BASF.
(8) Lutensol A8 is a surface active agent, 90% by weight in water, commercially available from BASF.

TABLE 3

Composition of overcoat solutions OC-06 to OC-11 (in g/l).

| INGREDIENTS | OC-06 | OC-07 | OC-08 | OC-09 | OC-10 | OC-11 |
|---|---|---|---|---|---|---|
| PVA-1 (1) (g) | 15.05 | 15.05 | 15.05 | 15.05 | 17.05 | 17.05 |
| PVA-2 (2) (g) | 14.80 | 14.80 | 14.80 | 14.80 | 14.80 | 14.80 |
| PVA-3 (3) (g) | 7.45 | 7.45 | 7.45 | 7.45 | 7.45 | 7.45 |
| citric acid (g) | 2.0 | | | | | |
| Mono-Na citrate (9) (g) | | 2.0 | | | | |
| Di-Na citrate (10) (g) | | | 2.0 | | | |
| Tri-Na citrate (11) (g) | | | | 2.0 | | |
| NaOH (10 wt. %) (12) (g) | | | | | 0.35 | 0.55 |
| Acticide LA1206 (6) (g) | 0.08 | 0.08 | 0.08 | 0.08 | 0.08 | 0.08 |
| Lupasol P (7) (g) | 0.20 | 0.20 | 0.20 | 0.20 | 0.20 | 0.20 |
| Lutensol A8 (8) (g) | 0.38 | 0.38 | 0.38 | 0.38 | 0.38 | 0.38 |
| Water (g) | 960.0 | 960.0 | 960.0 | 960.0 | 960.0 | 960.0 |

(1) to (8): see Table 2.
(9) Mono-Na citrate is mono sodium salt of citric acid dihydrate.
(10) Di-Na citrate is di sodium salt of citric acid.
(11) Tri-Na citrate is tri sodium salt of citric acid, here used as a dihydrate.
(12) NaOH (10 wt. %) is a solution of NaOH, 10.0% by weight in water.

Preparation of the Printing Plate

The compositions of the printing plate precursors PPP-01 to PPP-11 are summarized in Table 4.

The printing plate precursors PPP-01 to PPP-11 were subsequently submitted to a surface pH measurement. This measurement was made with a Metrohm 691 pH meter, that had been properly calibrated before with Merck Titripack buffers of pH 4.00 and 7.00. A Metrohm glass electrode type 6.0217.000 is placed on the plate surface, which is wetted with 50 µl of 0.1M $KNO_3$. The pH is followed during 10 minutes on a x-t recorder. This measurement is repeated 2 times (on different places/spots on the plate surface). The pH values after 5 minutes and 10 minutes are registered. The measurements on the first spot are rejected in order to account for the electrode adapting to the surface of the plate. The average value of the other measurements (namely 4 measurements, obtained at 2 different places/spots after 5 and 10 minutes) is calculated and is indicated in Table 4 as the surface pH for each printing plate precursor PPP-01 to PPP-11.

TABLE 4

Precursor composition and surface pH for PPP-01 to PPP-11.

| Printing Plate Precursor | Al support | Photopolymerizable layer | Overcoat layer | Surface pH |
|---|---|---|---|---|
| PPP-01 | S-1 | P-1 | OC-01 | 6.06 |
| PPP-02 | S-1 | P-1 | OC-02 | 6.11 |
| PPP-03 | S-1 | P-1 | OC-03 | 6.05 |
| PPP-04 | S-1 | P-1 | OC-04 | 5.93 |
| PPP-05 | S-1 | P-1 | OC-05 | 5.72 |
| PPP-06 | S-1 | P-1 | OC-06 | 4.29 |
| PPP-07 | S-1 | P-1 | OC-07 | 5.36 |
| PPP-08 | S-1 | P-1 | OC-08 | 5.74 |
| PPP-09 | S-1 | P-1 | OC-09 | 6.57 |
| PPP-10 | S-1 | P-1 | OC-10 | 6.34 |
| PPP-11 | S-1 | P-1 | OC-11 | 6.38 |

Invention Examples 1 to 5 and Comparative Examples 1 to 6

The precursors PPP-01 to PPP-11 were imaged on a Polaris XCV violet platesetter, commercially available from Agfa Graphics NV, at 30 µJ/cm² through a UGRA Step Wedge, having a wedge constant of 0.15.

After exposure a pre-heat treatment was performed in the pre-heat unit of a VSP-85 processor of Agfa Graphics NV at a speed of 1.2 m/min and a temperature, measured on the backside of the printing plate precursor, of 110° C.

After pre-heat, the plates were developed in a converted Agfa Graphics NV VPP-68 processor, wherein the developer section is filled with a gumming solution GUM-1, and dried after processing by hot air. The Agfa Graphics NV VPP-68 processor is converted in this way that the prewash section, the wash section and the gum section were disabled.

GUM-1 is a solution prepared as follow:
To 750 g demineralised water
100 ml of Dowfax 3B2 (commercially available from Dow Chemical)
31.25 g 1,3-benzene disulphonic acid disodium salt (available from Riedel de Haan)
31.25 ml Versa TL77, a polystyrene sulphonic acid (available from Alco Chemical)
10.4 g trisodium citrate dihydrate,
2 ml of Acticide LA1206, a biocide (available from Thor) and
2.08 g of Polyox WSRN-750 (available from Union Carbide)
were added under stirring and
demineralised water was further added to 1000 g.
The pH is between 7.2 and 7.8.

The plates were printed on a Heidelberg GTO52 sheetfed printing press and a print job was started using K+E Novavit 800 Skinnex ink (trademark of BASF Drucksysteme GmbH) and 100% Rotamatic (trademark of Rotaprint) as fountain solution, a compressible blanket and uncoated offset paper.

The following start-up procedure was used: first 5 revolutions with the dampening form rollers engaged, then 5 revolutions with both the dampening and ink form rollers engaged, then start printing to evaluate the roll-up performance. The roll-up is defined as the number of sheets required to achieve full ink density on the printing areas of the printed sheets. The roll-up value needs to be at low as possible and, in accordance with the present invention, at most 25 sheets, preferably at most 15 sheets, more preferably at most 10 sheets, most preferably at most 5 sheets. The roll-up values for the printing plates are indicated in Table 5.

The sensitivity is defined as the exposure energy density needed to obtain an optical density value on the plate of >97% of Dmax after pre-heat and development, (Dmax is the maximum value for the optical density (hereinafter also referred to as "OD") on the plate), as measured with a GretagMacBeth D19C densitometer on the reproduction of step 3 (OD=0.45) of the UGRA wedge on the plate. This sensitivity is calculated from the obtained data and the values for the printing plates are also indicated in Table 5.

TABLE 5

Results of the printing plates.

| EXAMPLES | PPP-type | Sensitivity ($.10^{-6}$ J/cm$^2$) | Surface pH | Roll-up (number of sheets) |
|---|---|---|---|---|
| Comparative Example 1 | PPP-01 | 12 | 6.06 | 250 |
| Comparative Example 2 | PPP-02 | 12 | 6.11 | 250 |
| Comparative Example 3 | PPP-03 | 11 | 6.05 | 100 |
| Invention Example 1 | PPP-04 | 13 | 5.93 | 25 |
| Invention Example 2 | PPP-05 | 10 | 5.72 | 3 |
| Invention Example 3 | PPP-06 | 10 | 4.29 | 4 |
| Invention Example 4 | PPP-07 | 12 | 5.36 | 3 |
| Invention Example 5 | PPP-08 | 13 | 5.74 | 3 |
| Comparative Example 4 | PPP-09 | 19 | 6.57 | 50 |
| Comparative Example 5 | PPP-10 | 11 | 6.34 | 100 |
| Comparative Example 6 | PPP-11 | 9 | 6.38 | 100 |

The Invention Examples 1 to 5 demonstrate that a printing plate precursor, having a surface pH value in the range of 1 to 6, exhibits an improved roll-up performance (between 3 and 25 sheets) in comparison with the printing plates of the comparative examples having a surface pH higher than 6, which exhibit an unacceptable roll-up performance (between 50 and 250 sheets).

The invention claimed is:

1. A method for making a lithographic printing plate precursor comprising the steps of:
   (a) providing a lithographic printing plate precursor including a support having a hydrophilic surface or which is provided with a hydrophilic layer, a photopolymerizable coating comprising a photopolymerizable composition including a polymerizable monomer or oligomer including an ethylenically unsaturated compound having at least one terminal ethylenic group and a polymerization initiator and an overcoat layer comprising a water soluble low molecular weight acid, wherein said overcoat layer has a surface pH-value ranging between 1 to 6;
   (b) image-wise exposing the precursor;
   (c) optionally heating the exposed precursor; and
   (d) processing and gumming the obtained precursor by applying a gum solution including at least one surface protective compound and optionally brushing the precursor, thereby removing at least part of the coating at non-exposed areas and gumming the plate in a single step;
   wherein the processing and gumming step is carried out in a gumming station which comprises a first and at least a second gumming unit.

2. The method according to claim 1, wherein the gum solution has a pH ranging between 5.5 and 8.

3. The method according to claim 1, wherein the surface pH-value ranges between 2.5 to 5.95.

4. The method according to claim 2, wherein the surface pH-value ranges between 2.5 to 5.95.

5. The method according to claim 1, wherein the surface pH-value ranges between 3.5 to 5.80.

6. The method according to claim 2, wherein the surface pH-value ranges between 3.5 to 5.80.

7. The method according to claim 1, wherein before the processing and gumming step the precursor is treated in a prewashing station by applying water or an aqueous solution to the coating.

8. The method according to claim 2, wherein before the processing and gumming step the precursor is treated in a prewashing station by applying water or an aqueous solution to the coating.

9. The method according to claim 1, wherein the photopolymerizable composition comprises a binder having at least one monomeric unit having an anionic group in the side chain.

10. The method according to claim 1, wherein the anionic group is an acid or a salt of an acid, said acid being selected from a carboxylic acid, a sulphonic acid, a phosphonic acid, a phosphoric acid or a phenolic acid.

11. The method according to claim 10, wherein the salt of the acid is an amine salt.

* * * * *